(12) United States Patent
Holsteyns et al.

(10) Patent No.: US 8,486,199 B2
(45) Date of Patent: Jul. 16, 2013

(54) ULTRASONIC CLEANING METHOD AND APPARATUS

(75) Inventors: Frank Holsteyns, Kortenberg (BE);
Alexander Lippert, Villach (AT);
Christian Degel, Blieskastel (DE);
Anette Jakob, St. Wendel (DE); Franz Josef Becker, St. Ingbert (DE)

(73) Assignees: Lam Research AG, Villach (AT);
Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 0 days.

(21) Appl. No.: 13/188,688

(22) Filed: Jul. 22, 2011

(65) Prior Publication Data
US 2013/0019893 A1    Jan. 24, 2013

(51) Int. Cl.
*B08B 3/12* (2006.01)
(52) U.S. Cl.
USPC .......... 134/1; 134/1.3; 134/34; 134/137; 134/151; 134/153
(58) Field of Classification Search
None
See application file for complete search history.

(56) References Cited

U.S. PATENT DOCUMENTS

| | | |
|---|---|---|
| 4,442,852 A | 4/1984 | Lord |
| 4,725,994 A | 2/1988 | Kaneko et al. |
| 5,438,554 A | 8/1995 | Seyed-Bolorforosh et al. |
| 5,803,099 A | 9/1998 | Sakuta et al. |
| 6,039,059 A | 3/2000 | Bran |
| 6,520,191 B1 | 2/2003 | Iwamoto et al. |
| 2007/0062555 A1 | 3/2007 | Chang et al. |
| 2007/0207707 A1* | 9/2007 | Montierth et al. ............ 451/36 |
| 2008/0017219 A1* | 1/2008 | Franklin .......................... 134/1 |
| 2008/0029125 A1* | 2/2008 | Olesen et al. ................ 134/1.3 |
| 2009/0099485 A1 | 4/2009 | Sarvazyan et al. |
| 2010/0104988 A1 | 4/2010 | Hayasaki et al. |

FOREIGN PATENT DOCUMENTS

WO    00/21692    4/2000

OTHER PUBLICATIONS

International Search Report, dated Oct. 19, 2012, from corresponding PCT application.

* cited by examiner

*Primary Examiner* — Michael Barr
*Assistant Examiner* — Ryan Coleman
(74) *Attorney, Agent, or Firm* — Young & Thompson

(57) ABSTRACT

A device and method for treating the surface of a semiconductor wafer provides a treatment fluid in the form of a dispersion of gas bubbles in a treatment liquid generated at acoustic pressures less than those required to induce cavitation in the treatment liquid. A resonator supplies ultrasonic or megasonic energy to the treatment fluid and is configured to create an interference pattern in the treatment fluid comprising regions of pressure amplitude minima and maxima at an interface of the treatment fluid and the semiconductor wafer.

17 Claims, 7 Drawing Sheets

311

321

331

ULTRASONIC CLEANING METHOD AND APPARATUS

BACKGROUND OF THE INVENTION

1. Field of the Invention

The invention relates to the field of ultrasonic (including megasonic) cleaning of substrate surfaces.

2. Description of Related Art

Removal of particulate contaminants from a semiconductor substrate can be accomplished by ultrasonic cleaning. When the frequency of ultrasound is close to or above 1,000 kHz (1 MHz) it is often referred to as "megasonic".

Acoustically activated bubbles close to any liquid-surface interface causes (a) shear stress at the surface, which can lead to the removal of particulate contaminants from the surface, (b) microstreaming, which can lead to the enhancement of diffusion limited reactions beneficial for electrochemical deposition processes, etching, rinsing and mixing, and (c) local enrichment of active components close to the surface such as free radicals, ozone and plasma, to impact chemical processes such as oxidation processes and etching.

Controlling the behavior of bubbles within a sound field is essential for any cavitation driven process. Furthermore, if cavitation should be spatially controlled, such as bubble arrangements and bubble activity at a solid-liquid interface during e.g. ultrasonic cleaning, the design of a specific sound field is required. This can be either done by an engineered acoustic near field interference pattern or a standing wave pattern, that can be achieved by a multiple resonator setup, a structured resonator, or a resonator stack parallel to the substrate.

The preferred way to obtain spatially controlled cavitation is the use of structured resonators. However, conventional structured resonators require the presence of a structured surface, which leads to 1) an increased liquid volume between resonator and substrate to fill up this structure (compared to a resonator stack parallel to the substrate) and this leads to an increased consumption of process chemicals, 2) the presence of bubbles, which may typically adhere on the structure and are difficult to remove or give rise to wetting issues within these structures.

The presence of adhered bubbles and wetting issues will both have an enormous impact on the efficient transmission of sound waves and the effective sound field in the liquid. In prior art solutions for e.g. cleaning by ultrasound it is the aim to produce a volume of high acoustic energy where cavitation is the basis of the cleaning effect. In such solutions the cavitation and with this the bubble movement weren't directly controlled by the resonator that produces the ultrasound. Prior art solutions where often based on tanks which are sonicated by low or high frequency ultrasound transducers ("Megasonic Cleaning" e.g. U.S. Pat. No. 6,148,833). Such solutions allow batch processes of single or groups of wafers.

There are also single wafer processes chambers, in which the transducers are located close to the wafers surface (e.g. WO0021692). Also here, cavitation is not spatially controlled. The aim is only to produce a high acoustic intensity in the process liquid.

A solution to clean a small region of a wafer is to use a transducer with a rod to transmit the sound waves (e.g. U.S. Pat. No. 6,039,059). From this rod, sound can be emitted to the process liquid to clean the wafer. Also with such a solution there is no direct control of bubble movement on the surface to be cleaned.

Therefore, it would be beneficial to integrate a structured resonator in a flat resonator block but in such a way that it does not require distance optimization to guarantee sufficient power transmission to the processing liquid as is required for many conventional resonator stacks that are positioned parallel to the substrate.

SUMMARY OF THE INVENTION

It is accordingly an object of the present invention to produce a method and device for treating articles that overcomes, at least in part, the disadvantages of the conventional art.

The invention, in part, pertains to a device for treating a surface of an article with a fluid, comprising a holder configured to position an article in a predetermined orientation, and a source of ultrasonic or megasonic energy positioned so as to vibrate a fluid medium adjacent the article. The source of ultrasonic or megasonic energy comprises a resonator body having a flat face confronting the holder and an internal refraction surface at an interface between two materials that differ from one another in at least one acoustic property.

In preferred embodiments of the device according to the present invention, the interface comprises a plurality of grooves having faces that inclined obliquely in relation to the flat face of the resonator body.

In preferred embodiments of the device according to the present invention, the at least one acoustic property is one or more properties selected from sound velocity, sound density and acoustic impedance.

In preferred embodiments of the device according to the present invention, the acoustic properties of the two materials and a shape of the internal refraction interface are selected such that transmitted sound beams are emitted from the flat face of the resonator body under emitting angles between $-90$ and $+90$ degrees to create an interference pattern in the treatment fluid comprising regions of pressure amplitude minima and maxima at an interface of the treatment fluid and the article.

In preferred embodiments of the device according to the present invention, the device also includes a generator of treatment fluid configured to discharge a treatment fluid adjacent the source of ultrasonic or megasonic energy. The treatment fluid is generated by decreasing a pressure of the treatment fluid, such that gas previously dissolved in the liquid comes out of solution in the form of bubbles.

In preferred embodiments of the device according to the present invention, the generator of treatment fluid comprises a main body housing provided with an inlet opening, a plurality of injection orifices or an injection slit provided in the main body, and an external liquid medium supply unit connected to the inlet opening.

In preferred embodiments of the device according to the present invention, the flat face of the resonator body is positioned adjacent to a space to be occupied by the article so that a gap is formed with a width w of about 0.1 mm to about 10 mm.

In preferred embodiments of the device according to the present invention, the source of ultrasonic or megasonic energy comprises plural piezoelectric elements mounted on the resonator body on a side opposite the flat face of the resonator body.

In preferred embodiments of the device according to the present invention, the plural piezoelectric elements are mounted on a surface of the resonator body that is essentially parallel to the flat face of the resonator body.

In preferred embodiments of the device according to the present invention, the device is a process module for single wafer wet processing of semiconductor wafers.

In preferred embodiments of the device according to the present invention, the resonator body comprises an upper part, distal to the holder, formed from aluminum or a plastic having high acoustic impedance or a polymer, and a lower part, proximate to the holder, formed from a polymer or a fluid confined within the resonator body, or a material selected from the group consisting of aluminum, sapphire, silicon and quartz.

Either or both parts of the resonator body may optionally be provided with a protective fluorinated plastic external coating layer.

In preferred embodiments of the device according to the present invention, each pair of faces defining one of the plurality of grooves defines an angle of 20-170°, preferably 30-150°, more preferably 60-120°, and most preferably about 90°.

The invention, in part, also pertains to a method for treating a surface of an article with a fluid, comprising positioning an article to be treated in a treatment apparatus in a predetermined orientation; and supplying ultrasonic or megasonic energy so as to vibrate a fluid medium adjacent the article. The ultrasonic or megasonic energy is supplied through a resonator body having a flat face confronting the holder and an internal refraction surface at an interface between two materials that differ from one another in at least one acoustic property.

In preferred embodiments of the method according to the present invention, the ultrasonic or megasonic energy is supplied in such a manner as to generate an interference pattern in the treatment fluid comprising regions of pressure amplitude minima and maxima at an interface of the treatment fluid and the article.

In preferred embodiments of the method according to the present invention, a treatment fluid is supplied adjacent to a surface of the article, the treatment fluid comprising a dispersion of gas bubbles in a treatment liquid.

It is to be understood that both the foregoing general description and the following detailed description are exemplary and explanatory and are intended to provide further explanation of the invention as claimed, but are not intended to limit the scope of protection afforded by the appended claims.

BRIEF DESCRIPTION OF THE DRAWINGS

The accompanying drawings are included to provide a further understanding of the invention. The drawings illustrate embodiments of the invention and together with the description serve more fully to explain the principles of the embodiments of the invention.

FIG. 6b shows a right front view of the bubble machine of FIG. 6a.

DETAILED DESCRIPTION

Figure 1A:
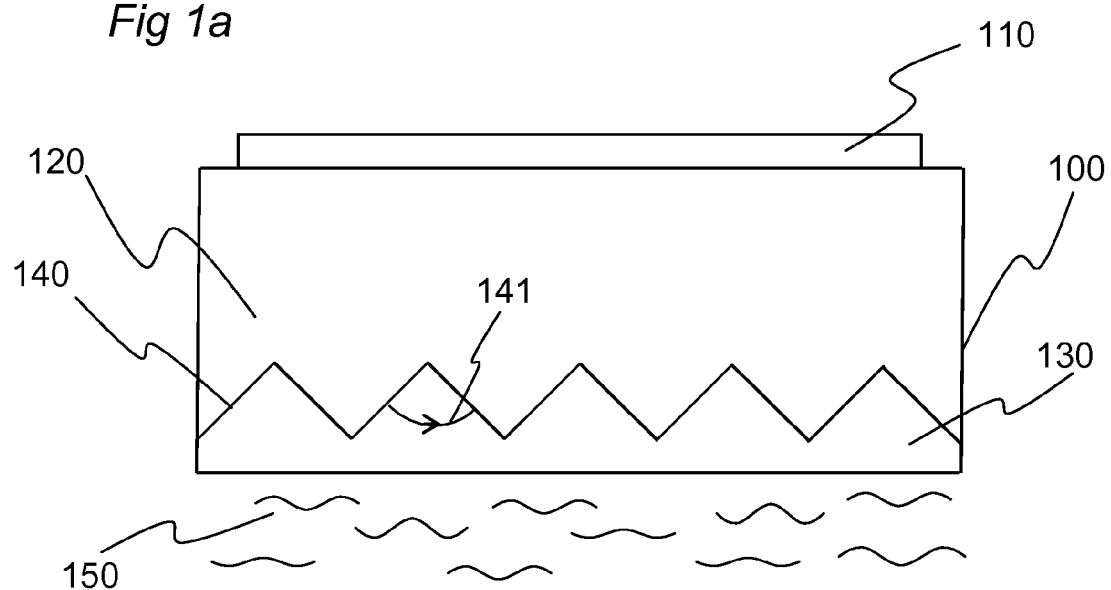
FIG. 1a shows a cross-sectional view of a resonator according to an embodiment of the present invention.

The dynamic response of a bubble in liquid to an acoustic field includes typically a volumetric oscillation and a translation motion. Given an arbitrary starting position, it can be observed that a bubble in an acoustic field moves towards either a pressure amplitude maximum or a pressure amplitude minimum. In a relatively weak acoustic field, a bubble driven below resonance (which means that the driving frequency of the imposed ultrasound field is below the fundamental resonance frequency of the bubble (calculated by the Minnaert equation)) moves to the pressure amplitude maximum, while a bubble driven above resonance moves towards the pressure amplitude minimum. Under normal conditions, bubbles remain at those positions they were driven to. The underlying mechanism is based on the primary Bjerknes force, which was first discovered and described by Bjerknes (1906). In an acoustic field of higher intensities a reversal of the primary Bjerknes force for bubbles below resonance size can be observed and these bubbles may reciprocate around a pressure amplitude minimum as shown by Doinikov (2001). Consequently, the creation of distinct regions of pressure minima and maxima in a liquid and at the solid-liquid interface allows creating either regions where bubbles are being (temporarily) collected or through which bubbles translate.

Furthermore, some of these bubbles exhibit, in addition to their volumetric oscillations, surface modes or even surface instabilities. These instabilities can grow and finally destroy the bubble. Besides bubble fragmentation, the mass of the bubble is continuously influenced by coalescence with other bubbles, rectified diffusion or dissolution. The thresholds for these activities are typically shown in a frequency dedicated phase diagram, which denotes the parametric regions for surface instabilities, translational stabilities, rectified diffusion and dissolution.

The required bubble population can be easily provided by bubble injection into the sonicated liquid. These bubbles can be tuned regarding size distribution and content (gas, vapor, chemicals). An interference pattern will create the required regions of pressure minima and maxima in the liquid and at the solid-liquid interface. Such an interference pattern can be generated by interfering sound beams that leave the resonator under emitting angles between −90 and +90 degrees.

The defined emitting angle can be realized 1) by a flat arranged piezoelectric material in combination with a structured refraction plane at the liquid-resonator-interface or 2) by angled arranged piezo materials combined with a flat plane at the liquid-resonator-interface.

However, as discussed above the presence of a structured interface at the liquid-resonator-interface is not always wanted and a flat interface is preferred. Therefore, in the device and method according to the present invention, an internal refraction plane is integrated within a resonator block, which has a flat liquid-resonator-interface.

The internal refraction plane is defined as the boundary between two materials of different acoustic properties like sound velocity, density and acoustic impedance. Depending on the acoustic properties of the two materials the geometry of the internal refraction plane is designed in such way that the transmitted sound beams will leave the flat liquid-resonator-interface under emitting angles between −90 and +90 degrees to create the required interference pattern.

The chosen material combinations consider the parameters sound velocity, density and acoustic impedance to reach an optimized transmission of the sound beams.

FIG. 1a shows a cross-sectional view of a resonator. The resonator is a body (100), on which a piezoelectric material (110) is joined. In this example, the body consists of two different parts: an upper part (120), on which the piezoelectric crystal (110) is attached and a lower part (130), which is in contact with a liquid (150). The surface separating these two parts is the so-called internal refraction plane (140). This surface has a specific geometrical structure and the materials of each part are chosen such that a well-defined interference sound field pattern is created in the adjacent liquid (150) when the piezoelectric material is driven electrically.

An example of the body could be that the upper part (120) is made out of aluminum, in which grooves with a specific angle (141) have been made as internal refraction plane (in this case 90 degrees). The lower part (130) is made out of a polymer or a fluid, which fills up the grooves in the aluminum and results in a smooth and flat interface between the resonator and the liquid. The acoustic impedance of the lower part is typically chosen to match the acoustic impedance of the adjacent liquid (150).

The design of the grooves as shown in FIG. 1a, is just one possibility of how to make an internal refraction plane within a solid body (100). The angle of the groove should preferably have an angle of 90 degrees, but this angle could vary between 20 and 170 degrees.

Alternatively, the lower part (130) could be made out of aluminum, sapphire, silicon or quartz. The upper part (120) can be made out of a plastic with specified high acoustic impedance or a polymer. The piezoelectric material (110) will be joined to this polymer. The polymer can be filled with particles to increase the acoustic impedance for improved sound transmission. The internal refraction plane (140) will be again located at the interface between the upper and lower part of the resonator.

Figure 1B:
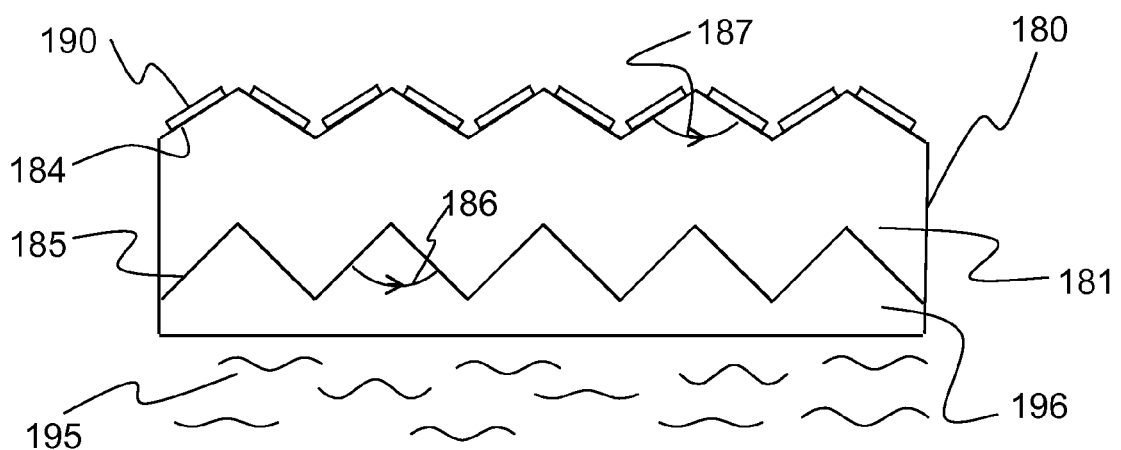
FIG. 1b shows a cross-sectional view of a resonator according to another embodiment of the present invention.

FIG. 1b shows a cross-sectional view of another design of a resonator. The body (180) consists of an upper part (181) and a lower part (196) that is separated by the internal refraction plane (185). The upper part of the resonator has two structured surfaces (184) and (185). The angles (186) and (187) define the structure of the surfaces and vary between 30 and 180 degrees. The piezoelectric materials (190) are joined to the upper part of the body. The lower part (196) of the body is connected to the internal refraction plane and immersed in the liquid.

Figure 2:
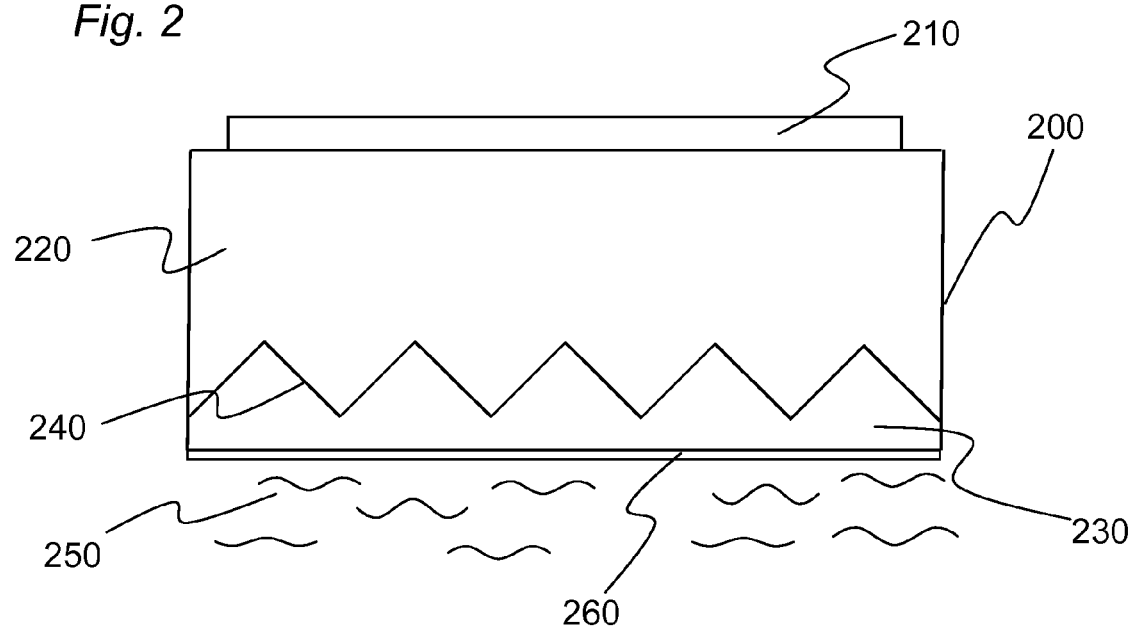
FIG. 2 shows a cross-sectional view of a resonator according to yet another embodiment of the present invention.

FIG. 2 shows a resonator similar to FIG. 1a but the body (200) has an additional layer (260). This layer separates the lower part of the body (230) from the liquid (250) and in optimized design it has a thickness equal or less than the wavelength of the sound beam inside the additional layer. This additional layer (260) can be a thin polymer coating, such as a PFA or a PVDF layer, to improve the surface properties of the body such as wettability, chemical resistance, wear resistance and scratch resistance.

The optimized thickness of the polymer coating should be as thin as possible, e.g. between 5 and 300 micron, preferable 50 micron. Alternatively, this additional layer can be a thin layer of silicon, silica or sapphire.

Figure 3A:
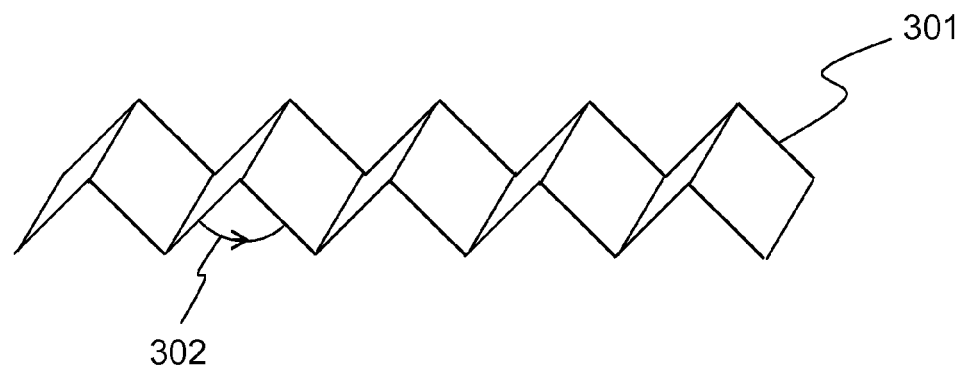
FIGS. 3a-3d shows three dimensional views of internal refraction planes according to various embodiments of the present invention.
Figure 3B:
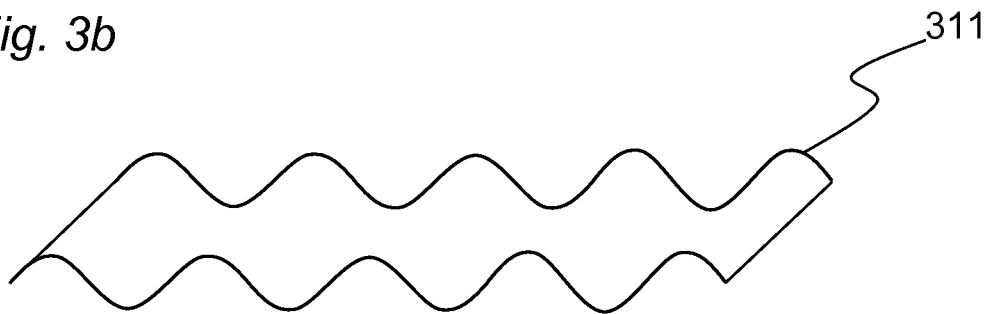
Figure 3C:
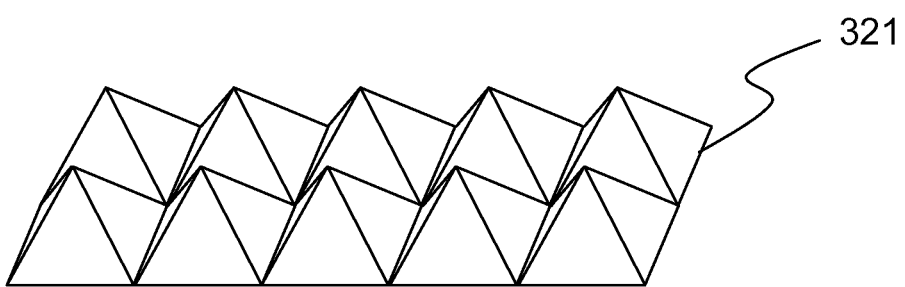
Figure 3D:
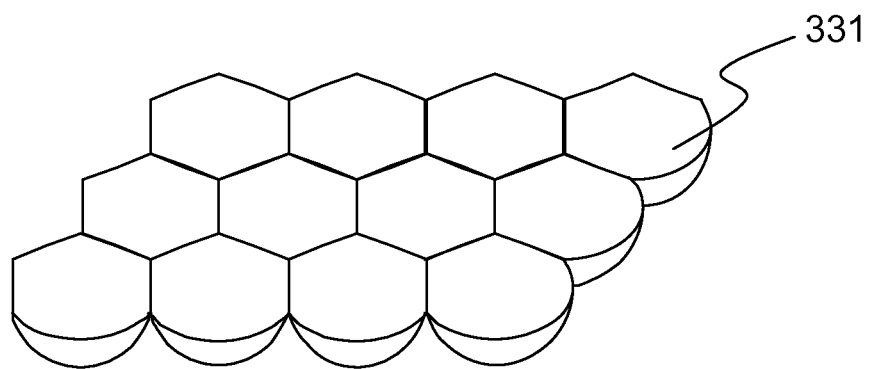

FIG. 3a-3d show three dimensional views of various internal refraction planes, which separate as shown in FIGS. 1 and 2 the upper and the lower part of the resonator. In FIG. 3a an internal refraction plane (301) has a triangular pattern, having a specific angle (302). In FIG. 3b, the internal refraction plane has a wave pattern. The internal refraction plane can have any kind of polyhedric or curved pattern. A symmetric pattern is preferred. An example for a polyhedric pattern is a pyramidal structure (321), or curved patterns can be formed from single sphere segments (331). Also, conical structures as the internal refraction plane are a possible embodiment of the invention.

Figure 4:
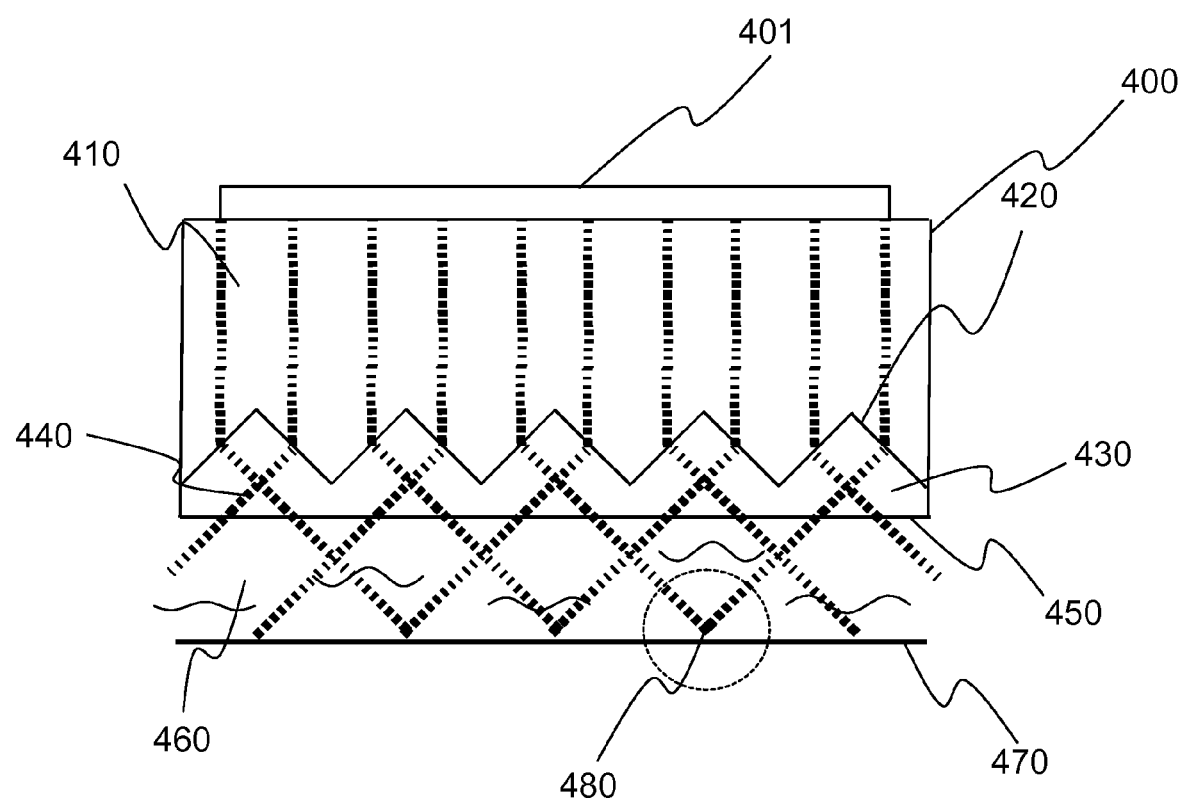
FIG. 4 shows a cross-sectional view of a working resonator and the related acoustic wave pathway, according to an embodiment of the present invention.

FIG. 4 shows a cross-sectional view of a working resonator (400) and the related acoustic wave pathway. The acoustic wave, which is generated by the piezoelectric crystal (401) travels through the upper part of the body (410) towards the internal refraction plane (420), where the wave will be refracted and travels under a different angle through the lower part of the body (430). The upper and lower parts of the body differ from one another in acoustic impedance, so that the angle under which the incident wave is transmitted can be calculated by Snell's law as well as the transmission coefficient.

The trajectory will continue through the liquid (460) toward a substrate (470). If the acoustic impedance between lower part of the body (430) and the liquid layer (460) are matched, the trajectory of the sound wave will not be impacted. Consequently, a unique acoustic interference pattern (440) is generated and results in pressure amplitude maxima (480) and minima at the substrate (470).

FIGS. 5a-d schematically depict the ongoing mechanisms in the pressure maxima and minima of the applied sound field. If bubbles (501) are injected in the developed acoustic field, they will be sorted, depending on their size, towards the pressure amplitude maxima and minima. In a relatively weak acoustic field, a bubble driven below resonance (which means that the driving frequency of the imposed ultrasound field is below the fundamental resonance frequency of the bubble (calculated by the Minnaert equation)) moves to the pressure amplitude maximum (502).

The bubbles typically grow due to coalescence in the pressure maxima until they reach the critical size given by the Minnaert equation at which time they will start moving towards a pressure amplitude minimum (503).

Figure 5A:
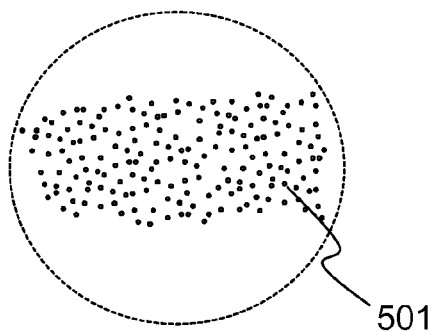
FIGS. 5a-d schematically depict the ongoing mechanisms in the pressure maxima and minima of the applied sound field.
Figure 5B:
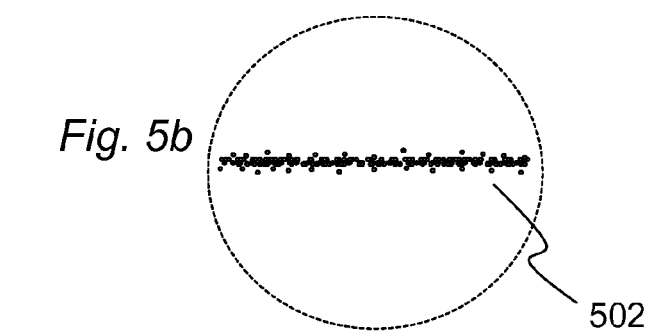
Figure 5C:
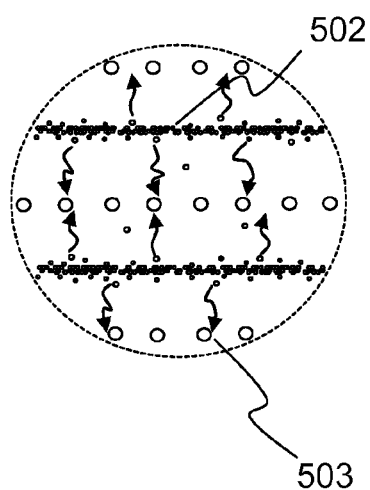
Figure 5D:
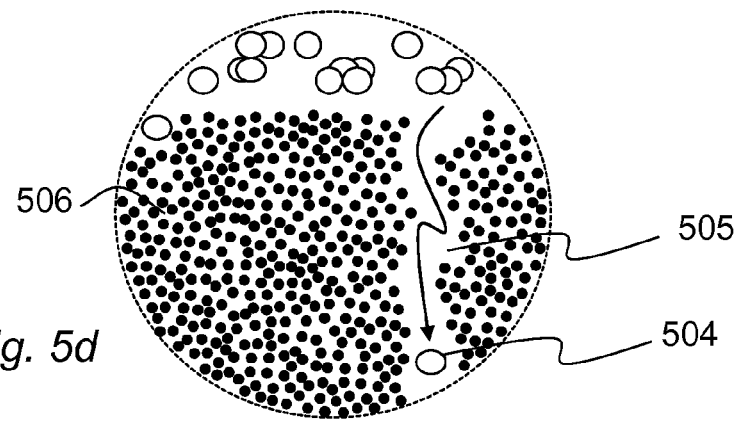

Furthermore, it has been found that operating in an acoustic pressure range of from $10^{-3}$ bar to $10^3$ bar allows to manage (in combination with the selected operational frequency) the bubble activity, which allows bubbles to create surface modes, surface instabilities, volumetric oscillations even leading to heavy collapsing bubbles, and therefore can create acoustic streaming, shear stress or enrich the liquid-solid interface with one or more gaseous components. An example of such an activity is shown in FIG. 5d, where a bubble (504) active in an applied acoustic field moves within the interference pattern and following a trajectory (505) can remove particulate contamination (506) from a substrate due to the local generation of shear stress.

The manufacturing of a resonator body according to the present invention may for example start with an aluminum block (which can be alternatively quartz or sapphire). One side of this block will preferably be flat and a piezoelectric crystal will be glued at this side. The opposite side will be structured and this side will become the internal refraction plane. The structure is in this example a sequence of triangular grooves. To flatten the surface, the grooves have to be filled up with a material, such as a polymer. The polymer is chosen in such a way that its properties allow matching its acoustic impedance with the acoustic impedance of the adjacent liquid.

Additionally, a chemical resistant surface is desired. Therefore a thin Teflon coating or silicon layer can be deposited or attached on the polymer. To optimize the sound transmission, the thickness of this additional layer is minimized. So the PVDF coating is reduced to a few micrometer, preferably between 5 and 300 micrometer and dense without having any voids or pinholes.

This resonator body is electrically driven at a frequency, which corresponds to one of the structural resonances of the resonator and varies typically between 10 kHz and 10 MHz. If a proper frequency is selected, the impedance between amplifier and resonator is matched to minimize energy losses at this level.

To overcome the cavitation threshold, bubbles of specific size and composition are injected into the sound field. Therefore, a bubble machine is positioned next to the resonator. This bubble machine consists of a main body, which is filled with a gasified and pressurized process liquid. At the outer side of the body a larger number of tiny holes are being drilled (laser drilling). Preferably, the size of these holes varies between 100 μm and 300 μm. These holes allow direct injection of the bubbles into the interference pattern.

Finally, the bubble machine and the resonator stack are positioned next to each other above and parallel to the substrate, in a way that there is still a gap between the resonator stack and the substrate, which will be filled up with process liquid. This gap can vary between 0.1 and 10 mm, but preferably between 0.5 and 4 mm.

Besides the in situ heterogeneous nucleation of bubbles in the liquid, it is especially beneficial to inject bubbles directly in to the liquid, which allows to operate at an acoustic pressure below the nucleation and the cavitation threshold (typically lower than 1 bar). Furthermore, bubble size distribution and content of the bubbles can be more easily tuned towards the targeted application. Examples of such a direct bubble injection into an acoustic field are shown in FIGS. 6a-6c and FIG. 5.

Figure 6A:
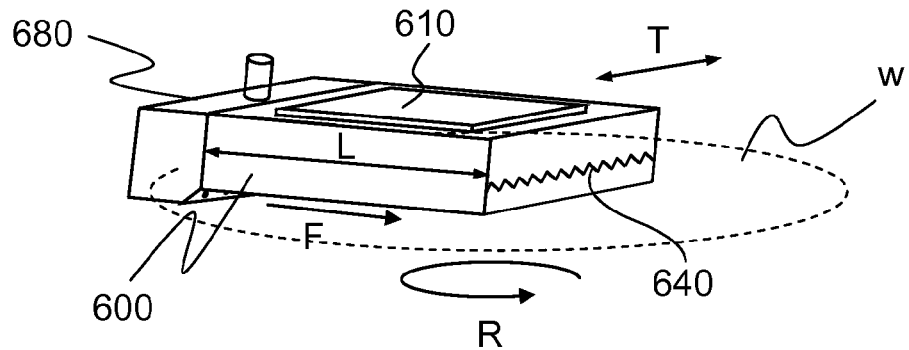
FIG. 6a shows an overview of the combination of a bubble injection machine with a resonator, close to a rotating substrate.

FIG. 6a is an example of a resonator (600), with an internal refraction plane consisting of a series of triangular grooves (640) to which a piezoelectric crystal (610) is attached. A bubble injection device (680) is positioned next to the resonator. The flow containing the bubbles (F) is preferably injected parallel to the regions of maximum and minimum pressure amplitude or alternatively under an angle up to 60 degrees. A typical length (L) over which a bubble flow can travel and have impact goes up to 5 cm. In this example a substrate (w) rotates (R) under the resonator and the resonator can execute a translation motion (T) to process the entire substrate.

Figure 6B:
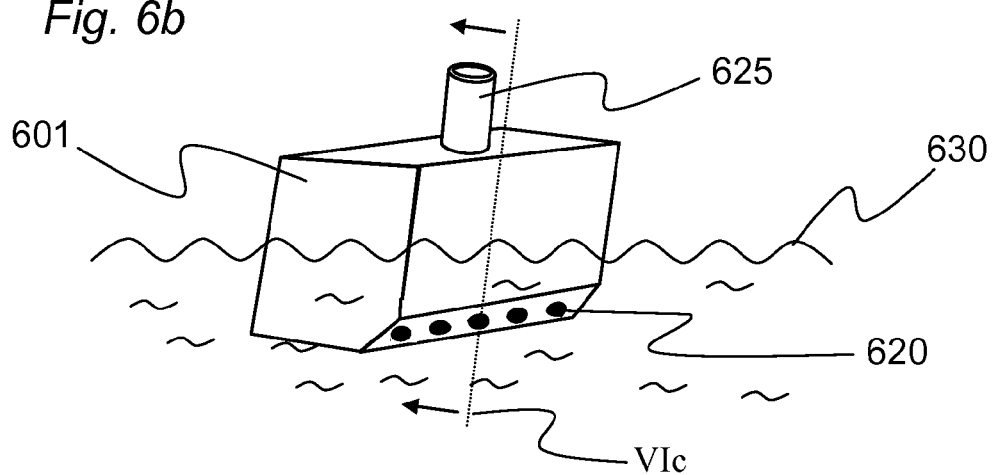
Figure 6C:
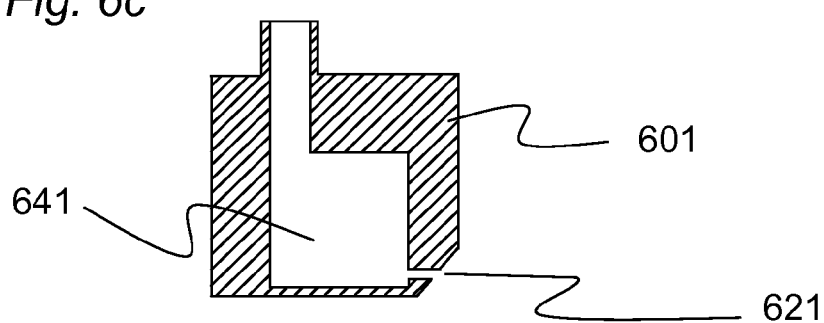
FIG. 6c shows a cross sectional view of the bubble machine of FIG. 6a, taken along the line IVc of FIG. 6b.

FIG. 6b shows a possible structure for the bubble machine (680) of FIG. 6a. In this right front perspective view, the main body housing (601) is shown, provided with one inlet opening (625). This inlet opening (625) has an inner diameter from about 1 mm to about 20 mm and is connected to an external medium supply unit, and provides a pressurized and a gasified medium to an inner chamber (641) of the bubble machine as shown in FIG. 6c. Injection orifices (620), (621) are positioned on an angled surface. Although 5 injection orifices are shown, there can be a wide range of injection orifices ranging from about 1 to about 30 per 100 mm$^2$, preferably about 16 per 100 mm$^2$. The injection orifices (620) have a diameter from about 50 μm to about 500 μm, but preferably between 100 and 350 μm and are designed to create a pressure drop in the medium between the inner chamber (641) and the surrounding medium (630), in which the bubble machine is immersed. This surrounding medium (630) can differ from the supplied medium. The pressure drop can be chosen in a range where the dissolved gas in the supplied medium starts to outgas. As a consequence of the outgassing, many small gas bubbles will be created and injected in the surrounding medium (630).

The immersion depth of the main body housing (601) should be chosen such that the injection orifices (620), (621) are submerged in the surrounding medium (630) and therefore set between about 0.5 mm and about 350 mm for immersion in a tank or between about 0.3 mm and about 10 mm for immersion between two parallel plates. Alternatively, the main body housing (601) can be entirely submerged in the surrounding medium (630).

Figure 7:
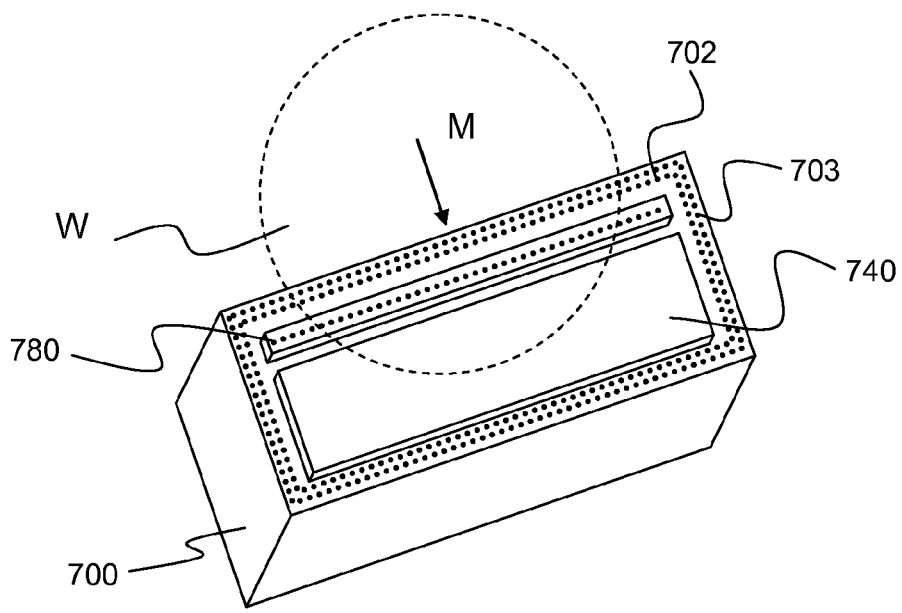
FIG. 7 shows an overview of the combination of a bubble injection machine with a resonator, close to a translating substrate.

An alternative design is given in FIG. 7, in which a resonator (700) has an internal refraction plane consisting of a series of triangular grooves (740) and a built-in bubble injection device (780). A series of process liquid inlets (702) and process liquid outlet (703) allow the wetting and dewetting of a substrate (W) while it moves linearly (M) over or under the resonator. Bubble injection device (780) may otherwise be as described for device (680).

Figure 8:
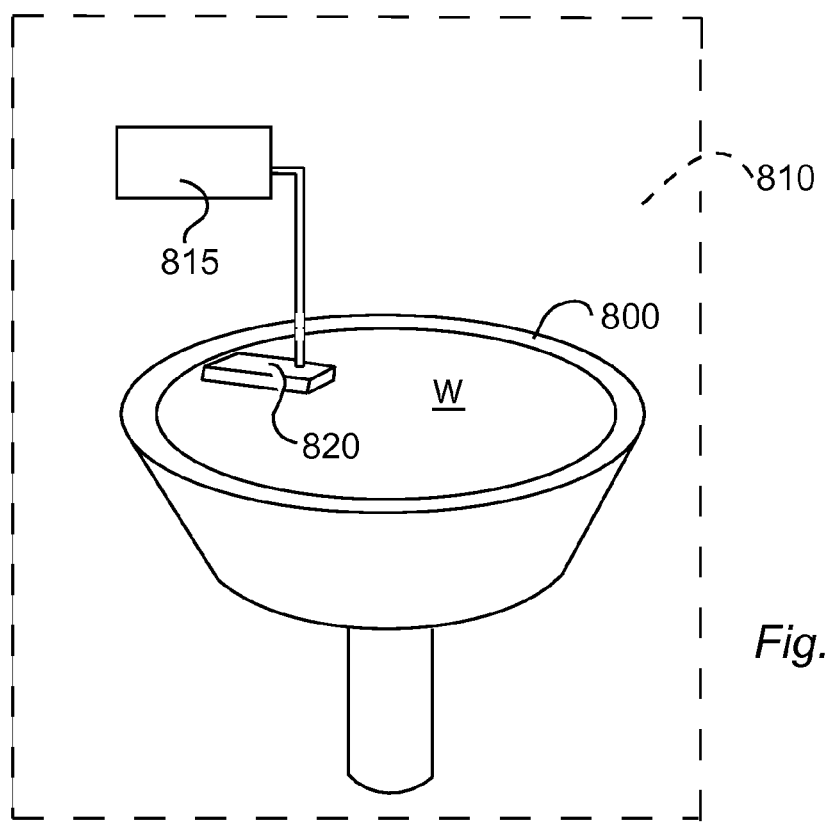
FIG. 8 schematically depicts an apparatus for single wafer wet processing equipped with an acoustic resonator assembly according to any of the foregoing embodiments.

FIG. 8 schematically depicts a resonator array 820, which could be constructed as described in connection with any of the foregoing embodiments or otherwise in accordance with the invention, positioned in relation to a substrate W, which in this instance is a semiconductor wafer, for example a 300 mm semiconductor wafer. Wafer W is positioned on a spin chuck 800, which in turn is mounted within a process module 810 for single wafer wet processing.

A frequency generator 815 drives the piezoelectric elements of the acoustic resonator assembly 820. If the acoustic resonator assembly is equipped with liquid supply openings as described above, then 815 may also constitute a fluid supply to those openings.

With reference for example to the embodiment of FIG. 1, when mounted in an apparatus as shown in FIG. 8, the process liquid will be present in the space between upper surface of wafer W and the downwardly-facing flat surface of the resonator, whereas the upwardly-facing surfaces of the acoustic resonator assembly will preferably be exposed to the gaseous ambient within the process chamber and not submerged in process liquid.

It will be understood that the foregoing description and specific embodiments shown herein are merely illustrative of the invention and the principles thereof, and that modifications and additions may be easily made by those skilled in the art without departing for the spirit and scope of the invention, which is therefore understood to be limited only by the scope of the appended claims.

What is claimed is:

1. A device for treating a surface of an article with a fluid, comprising:
   a holder configured to position an article in a predetermined orientation;
   a source of ultrasonic or megasonic energy positioned so as to vibrate a fluid medium adjacent the article;
   wherein said source of ultrasonic or megasonic energy comprises a resonator body having a flat face confronting said holder and contacting said fluid medium, and wherein the resonator body comprises an internal refraction surface at an interface between two materials of the resonator body which differ from one another in at least one acoustic property;
   wherein said interface comprises a repeating pattern of three-dimensional shapes; and wherein the acoustic properties of the two materials and a shape of the internal refraction surface at the interface are selected such that transmitted sound beams are emitted from the flat face of the resonator body at emitting angles between −90 and +90 degrees to create an interference pattern in the fluid medium comprising regions of pressure amplitude minima and maxima at an interface of the fluid medium and the article.

2. The device according to claim 1, wherein the interface comprises a plurality of grooves having faces that are inclined obliquely in relation to the flat face of the resonator body.

3. The device according to claim 1, wherein said two materials differ from one another as to least one acoustic property selected from sound velocity, sound density and acoustic impedance.

4. The device according to claim 1, further comprising a generator of treatment fluid configured to discharge adjacent said source of ultrasonic or megasonic energy a treatment fluid after decreasing a pressure of said treatment fluids, such that gas previously dissolved in said fluid comes out of solution in the form of bubbles.

5. The device according to claim 4, wherein the generator of treatment fluid comprises:
   a main body housing provided with an inlet opening;
   a plurality of injection orifices or an injection slit provided in the main body; and
   an external liquid medium supply unit connected to the inlet opening.

6. The device according to claim 1, wherein the flat face of the resonator body is positioned adjacent to a space to be occupied by the article so that a gap is formed with a width w of about 0.1 mm to about 10 mm.

7. The device according to claim 1, wherein the source of ultrasonic or megasonic energy comprises plural piezoelectric elements mounted on the resonator body on a side opposite the flat face of the resonator body.

8. The device according to claim 7, wherein the plural piezoelectric elements are mounted on a surface of the resonator body that is essentially parallel to the flat face of the resonator body.

9. The device according to claim 1, wherein said device is a process module for single wafer wet processing of semiconductor wafers.

10. The device according to claim 1, wherein the resonator body comprises an upper part, distal to said holder, formed from aluminum or a plastic having high acoustic impedance or a polymer, and a lower part, proximate to said holder, formed from a polymer or a fluid confined within the resonator body, or a material selected from the group consisting of aluminum, sapphire, silicon and quartz.

11. The device according to claim 2, wherein each pair of faces defining one of said plurality of grooves defines an angle of 20-170°.

12. A method for treating a surface of an article with a fluid, comprising:
   positioning an article to be treated in a treatment apparatus in a predetermined orientation; and
   supplying ultrasonic or megasonic energy so as to vibrate a fluid medium adjacent the article;
   wherein the ultrasonic or megasonic energy is supplied through a resonator body having a flat face confronting said holder and contacting said fluid medium, and an internal refraction surface at an interface between two materials of the resonator body which differ from one another in at least one acoustic property;
   wherein said interface comprises a repeating pattern of three-dimensional shapes; and
   wherein the acoustic properties of the two materials and a shape of the internal refraction surface at the interface are selected such that transmitted sound beams are emitted from the flat face of the resonator body under emitting angles between −90 and +90 degrees to create an interface pattern in the fluid medium comprising regions of pressure amplitude minima and maxima at an interface of the fluid medium and the article.

13. The method according to claim 12, further comprising supplying adjacent to a surface of the article a treatment fluid comprising a dispersion of gas bubbles in a treatment liquid.

14. The device according to claim 11, wherein each pair of faces defining one of said plurality of grooves defines an angle of 30-150°.

15. The device according to claim 11, wherein each pair of faces defining one of said plurality of grooves defines an angle of 60-120°.

16. The device according to claim 11, wherein each pair of faces defining one of said plurality of grooves defines an angle of about 90°.

17. The device according to claim 1, wherein each of said two materials is a solid.

* * * * *